June 5, 1962 R. BROWNFIELD 3,038,105
ELECTRICAL CIRCUIT BOARD
Filed May 18, 1959 2 Sheets-Sheet 1
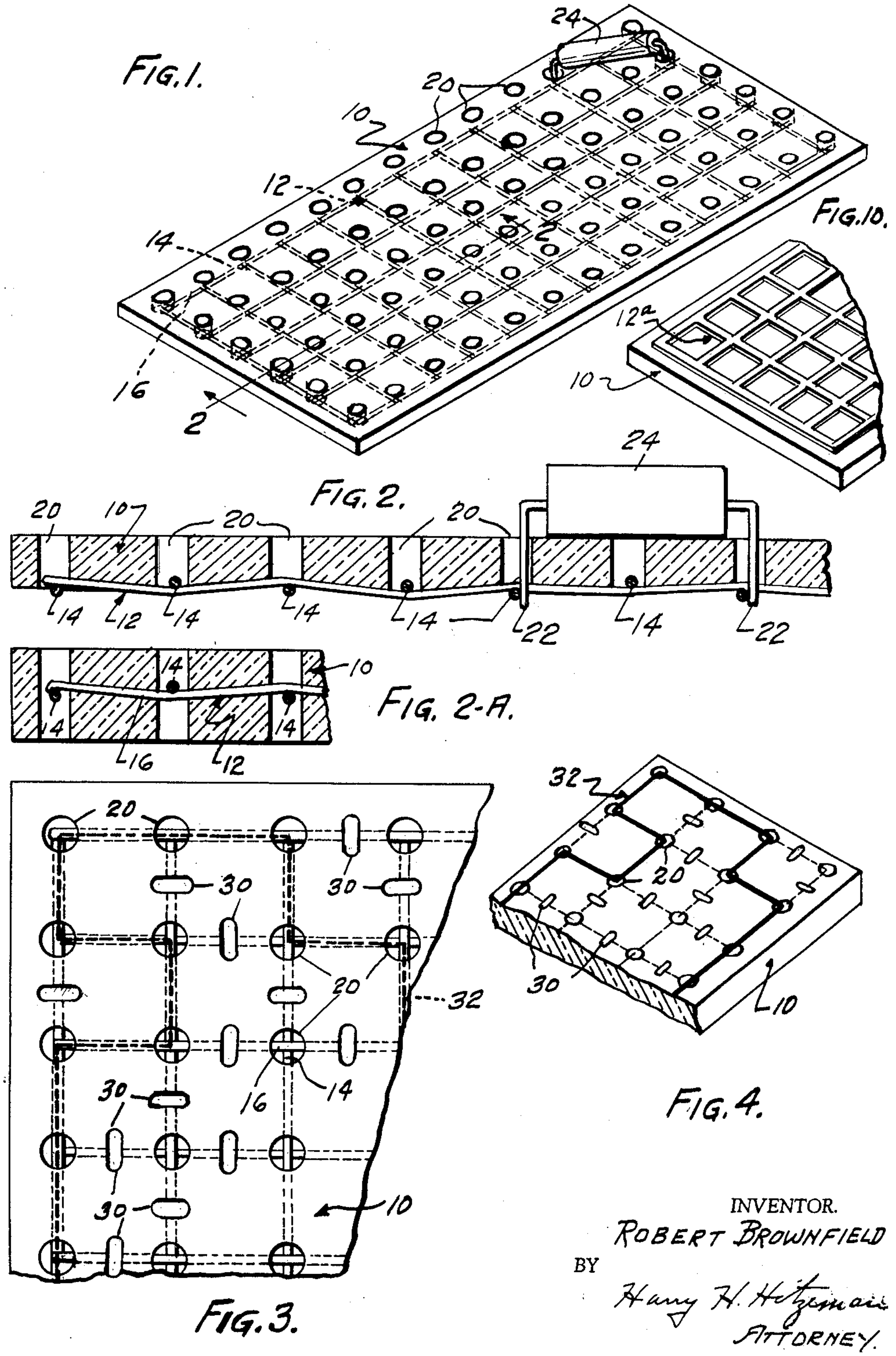
FIG. 1. FIG. 10. FIG. 2. FIG. 2-A. FIG. 3. FIG. 4.
INVENTOR.
ROBERT BROWNFIELD
BY
Harry H. Hitzeman
ATTORNEY.

June 5, 1962 R. BROWNFIELD 3,038,105

ELECTRICAL CIRCUIT BOARD

Filed May 18, 1959 2 Sheets-Sheet 2

INVENTOR.
ROBERT BROWNFIELD
BY
ATTORNEY.

3,038,105
ELECTRICAL CIRCUIT BOARD
Robert Brownfield, 2N 112 Virginia St., Glen Ellyn, Ill.
Filed May 18, 1959, Ser. No. 814,095
7 Claims. (Cl. 317—101)

My invention relates to improvements in electric circuits and components thereof.

My invention relates more particularly to electric circuits of the type wherein the conductor or circuit wiring is embedded in or attached to a panel of insulating material and suitable openings are provided therein for terminal connection of the prongs or pigtails of electrical elements such as resistors, condensers, relays, switch components and the like.

A further object of the invention is to provide circuit components and the process of preparing the same wherein only the terminals of the circuit are exposed for connection thereto of external circuit components such as resistors, condensers, impedances, thermionic tubes, switches and the like by the soldering method, the connector leads in the circuit being entirely embedded within the insulated panel.

In my previously filed and co-pending application Serial No. 757,625, filed August 27, 1958, I have shown and described circuit construction in a panel board wherein either wire or strip metal is used as a conductor, the wire or metal being placed in a pre-arranged relationship so that a complete circuit is formed thereby, suitable connector prongs or other means being provided at desired points for contact with the connecting prongs of electrical units of the circuit.

In the present invention the use of wires or flat metal strips is continued, the same however being distinguished from that shown in my preceding application for patent in that I provide a metallic screen embedded in or attached to an insulating panel by some standard method such as molding, sealing, plating, bonding, etc., the insulating panel having openings therein at each point where the conductor wires or strips cross, the openings being for the insertion of leads from electrical components.

One of the principal objects of the present invention is to provide an insulating panel which has a metallic screen embedded therein, by the use of which any desired circuit can be provided.

A further object of the invention is to provide a panel including an electric circuit which consists of criss-cross wires with openings in the panel board for soldering connectors of electrical components where desired, the board being capable of being cut through or punched to sever the wire or strip of metal so that any desired electrical circuit can be made therein.

Another object of the invention is to provide an electric circuit associated with or attached to an insulating panel, the circuit being arranged as desired by cutting through the panel and wires or strips at specific points.

For a more comprehensive understanding of the invention and the details thereof, reference may be had to the following description and the accompanying drawings, upon which:

FIG. 1 is a front perspective view of a rectangularly shaped panel board with a wire screen attached thereto and showing the method in which electrical components are positioned thereon;

FIG. 2 is a fragmentary cross sectional view of the panel board taken on the line 2—2 of FIG. 1;

Figure 5:
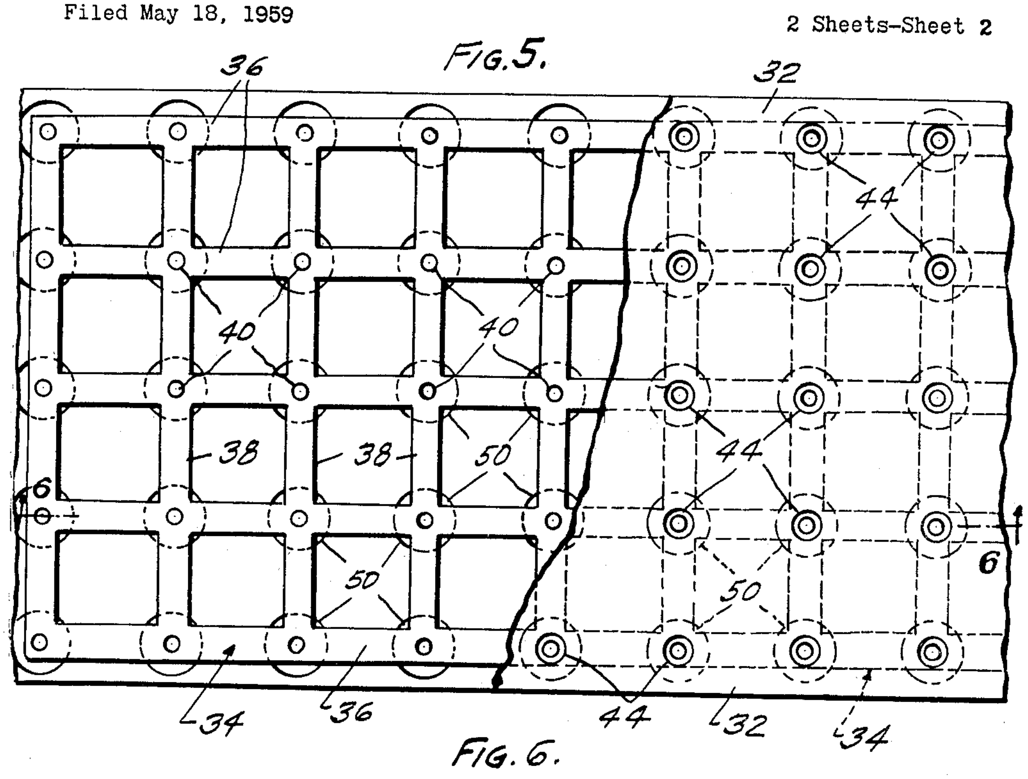
Figures 6, 7, 8, 9:
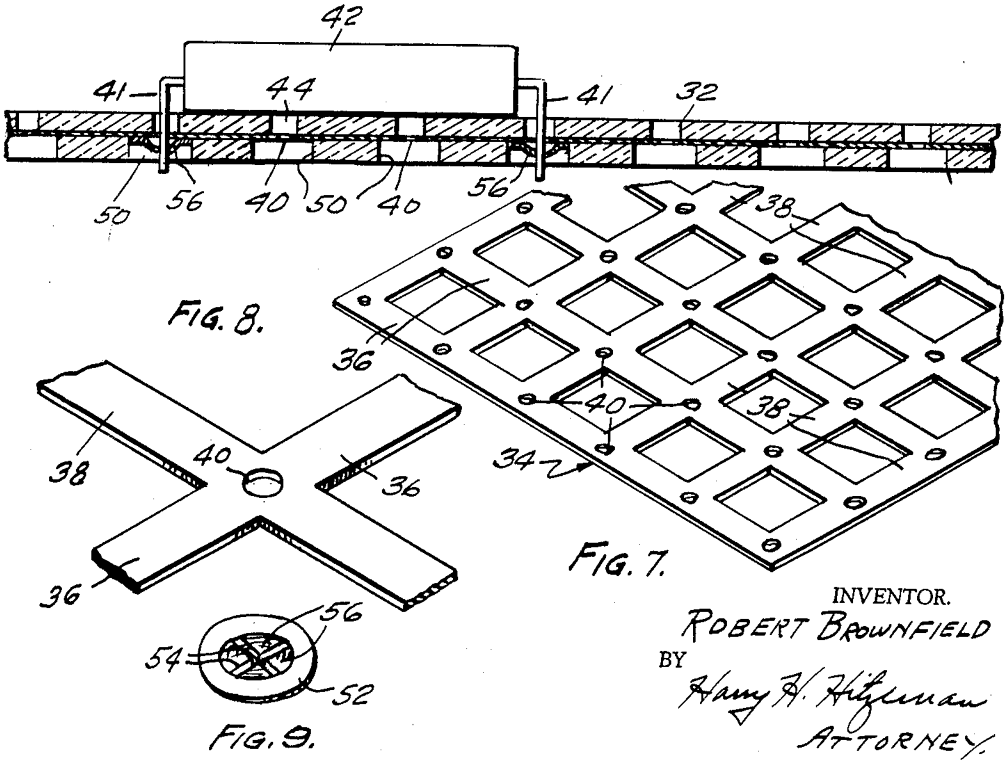

FIG. 2–A is a fragmentary cross-sectional view similar to FIG. 2, showing a modified form of construction wherein the metallic screen is embedded in an insulated panel board;

FIG. 3 is a fragmentary plan view of a portion of the panel board shown in FIG. 1;

FIG. 4 is a fragmentary perspective view thereof showing in full lines a portion of a circuit that is provided thereby;

FIG. 5 is a fragmentary plan view of a modified form of panel board, a portion of the same being broken away to more clearly show the metallic strip therein;

FIG. 6 is a cross-sectional view thereof taken on the line 6—6 of FIG. 5;

FIG. 7 is a fragmentary front perspective view of the metallic web conductor shown in FIGS. 5 and 6;

FIG. 8 is an enlarged fragmentary perspective view of one of the strip crossings;

FIG. 9 is a perspective view of a disc-shaped locking socket which I employ; and FIG. 10 is a fragmentary perspective showing of a plated circuit.

In the embodiment of the invention illustrated, in FIG. 1 I have shown a rectangularly shaped panel 10 which may be formed of a plastic sheet suitable for the purpose and which has a wire screen 12 bonded or otherwise attached to the bottom thereof. The screen 12 may be of the usual type which has the woven criss-cross wires 14 and 16, and at each intersection of the same I provide an opening 20 in the panel 10 so that the metallic prongs 22 of an electrical component 24 may be fastened on the panel board and an electrical connection is made by soldering the prongs to the wires.

In order to form a circuit to meet the desired requirements, the conductor wires are cut through by a punching or other operation. Thus as shown in FIGS. 3 and 4, the punching of the openings 30 provides a circuit which, as shown in FIG. 3 by the dotted line 32, is continuous and may follow any desired path, depending directly upon the number of components which it is desired to mount on the panel and the positions thereof.

With the construction thus shown it can be seen that the panels may be manufactured with the woven screen wire 12 either attached thereto or embedded therein as shown in FIG. 2–A, and provided with suitable openings 20 at all of the intersections of the woven screen. It is then a simple matter for the user to mount the electrical components which he desires to include in the circuit and to either cut or punch the holes 30 as shown in FIG. 3 to complete the circuit.

In the modification of the invention shown in FIGS. 5 to 9, the conductor screen embedded in the insulated panel 32 may be in the nature of a web 34 having the longitudinal and vertical strip portions 36 and 38. An opening 40 is provided at each of the intersections of the longitudinal and transverse strips 36 and 38 so that the prong 41 of an electrical component 42 may be inserted therethrough, suitable openings 44 also being provided in the panel board at all of the intersections.

The lower side of the panel board may have enlarged openings 50 at each of the intersections so that when the prongs 41 of an electrical component 42 are extended through the aligned openings 40 and 44, both an electrical and a mechanical connection may be made to the metallic web or strip by use of the disc-shaped locking socket 52 which by reason of the cross-slits 54 therein is formed with the spring fingers 56 that grip the prongs 41 and resist removal of the same, at the same time forming with the metallic web 34 a good electrical connection to the electrical component. With this construction, as with that shown in FIGS. 1–4, the insulating panel is cut through at any point so as to form any desired circuit.

In FIG. 10 I have shown a panel board 10 upon which a metallic circuit such as the circuit 12*a* is applied by plating, the same being also in the form of a screen or web and connections being made at desired points at intersections of the strips of the web by soldering, as has heretofore been explained in connection with the showing of FIGS. 1–4. The treatment of the panel board to provide a desired circuit will be the same throughout except that the web 12a is applied by plating rather than in the form of a wire or an embedded sheet metal web.

From the above and foregoing description it will be apparent to those skilled in the art that I have provided a comparatively simple type of panel and electrical circuit construction of a universal type so that the panels may be purchased by users and an electrical circuit following any desired lines may be effected therewith by simply punching or cutting through the wire or metal strip at desired points to form the desired circuit.

I contemplate that changes and modifications may be made in the exact details shown and I do not wish to be limited in any particular; rather what I desire to secure and protect by Letters Patent of the United States is:

1. A universal circuit board for producing a plurality of circuit arrangements comprising a panel of insulating material, an electrically unitary preformed grid having first conductors and second conductors, said grid being secured to and supported by said panel, said first and second conductors having a plurality of intersections at all of which electrical contact is established between said conductors, a plurality of first openings in said panel disposed adjacent and aligned with said intersections to expose said intersections at said first openings, said circuit board serving as a universal circuit board from which a particular circuit can be produced, second openings through certain of said conductors intermediate said intersections to disconnect certain of said intersections from certain other of said intersections to produce a particular circuit wiring arrangement and electrical elements having leads connected to said grid, said leads being connected to said grid at certain of said exposed intersections.

2. The circuit board of claim 1 wherein said second openings through said conductors extend into said panel at portions of said panel adjacent said second openings through said conductors.

3. The circuit board of claim 1 wherein said grid and panel are secured together, said second openings extending through said conductors and said panel.

4. The circuit board of claim 1 wherein said conductors of said grid are flat metallic members.

5. The circuit board of claim 1 wherein said electrical elements are physically supported by said insulating panel with said elements in engagement with said insulating panel, and including means electrically connecting said leads to said exposed intersections.

6. The circuit board of claim 1 wherein said panel has a face and a second area spaced from said face, said grid being disposed at said area of said panel, and including electrical elements disposed adjacent said face, said electrical elements having leads extending through said first openings in said panel, and means provided at said exposed intersections to electrically connect said leads to said exposed intersections.

7. The circuit board of claim 1 including connecting socket means electrically connected to said exposed intersections and engaging said leads, said socket means having intersecting slits providing a prong therebetween, said leads being inserted into said socket means with said prong in electrical engagement with said leads.

References Cited in the file of this patent

UNITED STATES PATENTS

| | | |
|---|---|---|
| 2,019,625 | O'Brien | Nov. 5, 1935 |
| 2,586,854 | Myers | Feb. 26, 1952 |
| 2,883,447 | Dahl | Apr. 21, 1959 |

OTHER REFERENCES

Publication I "Selectron Harness System" published in Selectron Engineering Bulletin No. 9, published by Tape Cable Corporation, 790 Linden Avenue, Rochester 10, N.Y. (page 2 relied on).

Publication II, "Printed Circuit Techniques," National Bureau of Standards Circular 468, published by U.S. Department of Commerce Nov. 15, 1947 (page 27 relied on).